United States Patent [19]
Parlour et al.

[11] Patent Number: 5,498,979
[45] Date of Patent: *Mar. 12, 1996

[54] ADAPTIVE PROGRAMMING METHOD FOR ANTIFUSE TECHNOLOGY

[75] Inventors: David B. Parlour, Pittsburgh, Pa.; F. Erich Goetting, Cupertino, Calif.; Stephen M. Trimberger, San Jose, Calif.; Edel M. Young, Palo Alto, Calif.

[73] Assignee: Xilinx, Inc., San Jose, Calif.

[*] Notice: The term of this patent shall not extend beyond the expiration date of Pat. No. 5,349,248.

[21] Appl. No.: 310,111

[22] Filed: Sep. 20, 1994

Related U.S. Application Data

[62] Division of Ser. No. 940,125, Sep. 3, 1992, Pat. No. 5,349,248.

[51] Int. Cl.$^6$ ............... H03K 19/177; H01H 37/76
[52] U.S. Cl. ............ 326/38; 327/525; 340/825.84; 364/489; 364/490
[58] Field of Search ............ 326/38–39, 9–10; 327/525; 340/825.83, 825.84, 825.87, 825.79, 827; 364/716, 488–491

[56] References Cited

U.S. PATENT DOCUMENTS

| | | | |
|---|---|---|---|
| 4,605,928 | 8/1986 | Georgiou | 340/825.94 |
| 4,758,745 | 7/1988 | Elgamal et al. | 307/465 |
| 4,974,048 | 11/1990 | Chakravorty et al. | 357/40 |
| 5,153,463 | 10/1992 | Keiichi | 307/465 |
| 5,223,792 | 6/1993 | El-Ayat et al. | 324/158 |
| 5,349,248 | 9/1994 | Parlour et al. | 326/38 |

OTHER PUBLICATIONS

Soukup, J.; "Circuit Layout"; IEEE, vol. 69; Oct. 1981; pp. 1281–1304; (article pp. 21–44).

Greene, J.; Roychowdhury, V.; Kaptanoglu, S.; El Gamal, A.; "Segmented Channel Routing"; Actel Corporation; 27th ACM/IEEE Design Automated Conference; 1990; Paper 34.2; pp. 567–572.

Brown, S.; Rose, J.; Vranesic, Z.; "A Detailed Router for Field–Programmable Gate Arrays", IEEE International Conference on Computer–Aided Design, ICCAD–90, Digest of Technical Papers, Nov. 11–15, 1990; pp. 382–385.

Lorenzetti, M.; Baeder, D.; "Physical Design Automation of VLSI Systems"; Chapter 5 'Routing'; Edited by Bryan Preas and Michael Lorenzetti; The Benjamin/Cummings Published Company, Inc.; copyright 1988; pp. 157–210.

*Primary Examiner*—Edward P. Westin
*Assistant Examiner*—Jon Santamauro
*Attorney, Agent, or Firm*—Jeanette S. Harms; Edel M. Young

[57] ABSTRACT

For antifuse programmable integrated circuit devices, in particular FPGA devices, the invention allows for alternative routing around antifuses which fail to program. The chip architecture includes wiring segments and antifuses which together allow for alternative routes around every antifuse in the event of failure of that antifuse. The method includes programming the device under control of a computer which can recalculate routes in the event of an antifuse which fails to program. Preferably the initial routing distributes unused wiring segments through the chip to be available for routing around a failed antifuse. When a failure occurs, the method includes determining an alternative route around every failed antifuse. The alternative route may be established directly after the antifuse has failed or after all initially selected antifuses have been programmed. The method also includes swapping of logic cell inputs, logic cells, and/or logic blocks from their original layout to adapt to a failed antifuse without changing the timing of signals which would have used the failed antifuse.

14 Claims, 7 Drawing Sheets

ADAPTIVE PROGRAMMING METHOD FOR ANTIFUSE TECHNOLOGY

This application is a division of application Ser. No. 07/940,125, filed Sep. 3, 1992, now U.S. Pat. No. 5,349,248.

FIELD OF THE INVENTION

The present invention relates to programming logic devices, more particularly to programming field programmable devices having a programmable interconnect structure interconnectable by antifuses.

BACKGROUND OF THE INVENTION

FPGAs—SRAM and Antifuse

Field programmable gate arrays (FPGAs) comprise programmable logic blocks and a programmable interconnect structure for interconnecting the blocks. The logic blocks are programmed to perform a desired function and the interconnect structure comprises wiring segments which may be interconnected to connect the logic blocks together as desired. Some interconnect structures are interconnected by turning on transistors which interconnect the wiring segments. Others are interconnected by programming antifuses which interconnect the wiring segments. Antifuse programming is achieved by applying sufficiently different voltages to the wiring segments which contact the two terminals of the antifuse to cause current to pass through the antifuse and cause the antifuse to become permanently conductive.

Full Testability

When manufacturing FPGAs which are programmed by turning on transistors, it is possible to fully test the device before the device is sold to a customer who will program the device, to assure that all transistors operate properly. Thus the yield of devices which are successfully configured by the user is very high.

On the other hand, antifuse devices can only be tested for nonconductivity of the antifuses in their unprogrammed state. Antifuse devices can not be tested for antifuse programmability before going to a customer, because antifuse devices are one-time programmable, and full testing (which includes determining whether each antifuse will program) would destroy the programmability the customer desires. Given the large number of antifuses that must be programmed in a typical FPGA, even relatively low antifuse failure rates can lead to unacceptably high FPGA device failure rates, since each connection in the device must be successfully completed for the device to work as designed.

Some manufacturers of antifuse devices include extra test antifuses, which are programmed at the factory to determine if the device antifuses will program properly. If any of these test antifuses fail to program, the entire part is rejected. However, these test antifuses do not guarantee that the device antifuses will all function properly. Sometimes all test antifuses may program properly and yet a device antifuse will fail, just due to statistical variation. Thus even with test antifuses, a manufacturer will sell some number of devices which fail to function properly, and the perceived quality of the manufacturer's product suffers accordingly. The effective cost to the user is also increased accordingly.

Typical Programming Method

A user typically enters a logic design into a computer using a schematic capture package or a hardware description language. The computer then proceeds through an elaborate set of steps to generate a list of transistors to turn on or antifuses to program (or both) in order to cause a particular field programmable logic device to implement the user's design. Typical steps for converting a user's logic design into a list of antifuses or transistors include 1) mapping the user's logic design into logic elements of a suitable FPGA device (called "technology mapping");

2) placing each portion of the user's logic into a corresponding logic cell in the device; and 3) routing the signals on particular wiring segments to interconnect the portions of the user's logic to form the overall design.

Additional steps can also be performed, for example optimizing the logic before and during the technology mapping step, and iteratively improving the placement as well as the routing. The computing power to perform the above steps is considerable.

By contrast, the computing power needed to actually program the logic device is relatively trivial. A personal computer or work station (called the host) is typically used for the mapping, placing and routing steps, and a simple programming box attached to the computer, which includes a simple microprocessor, typically receives data or instructions from the computer or work station and applies the voltages necessary to program the device.

A simple programming box can indicate to the host computer if an antifuse did not program properly. In the past, an indication that an antifuse did not program properly has meant that the entire antifuse device failed and may not be used.

Distribution of Programming Voltages and Acceptable Parts

FIG. 1 shows a curve of voltage distribution and ranges over which devices are accepted and rejected. After the devices are manufactured and before they leave the factory, the devices are tested for a variety of purposes, including whether any of the antifuses become programmed under the highest operating voltage (for example 7 volts) for which the device is rated. In a successful device, no antifuses will program. If any antifuses do become programmed, the device must be rejected. Those devices in which antifuses become programmed below the maximum operating voltage are illustrated in the shaded region labeled FACTORY REJECT. These devices will not be sold to customers, and represent lost profits but not lost reputation for reliability. When devices are shipped to customers, they are programmed in the field, at a programming voltage considerably higher than the operating voltage. The programming voltage is limited by the voltage at which programming transistors and other elements will be destroyed, for example the transistor breakdown voltage. Any device for which an antifuse was designated to be programmed but failed to program will be rejected in the field, and represents both lost reputation and lost profit, either to the manufacturer or to the user. Devices in which at least one antifuse failed to program are indicated by the shaded region FIELD REJECT. The middle region, labeled GOOD, shows a device in which all antifuses program at a voltage higher than the operating voltage and lower than the programming voltage which will be used.

Acceptable Yield

Traditional one-time programmable logic devices which cost a few dollars have been considered acceptable if the yield of successfully programmed devices is on the order of 95%. That is, if 95% of the devices shipped to a customer fall into the category labeled GOOD. However, for an FPGA device costing several hundred dollars, a customer is not likely to be satisfied with a yield of successfully programmed devices of only 95%. The customer is more likely to require a yield of at least 99% successfully programmed devices to consider the money well spent. In other words, the customer is likely to require that no more than 1% of the devices have antifuses which fail to program at the programming voltage used. The manufacturer must cover the cost of yield loss one way or another, usually by shipping replacement devices or by reimbursing the user for failed devices.

Achievable Yield

In a device having 700,000 antifuses, of which 2% or 14,000 are typically programmed for a design, a failure rate of 1 antifuse per million produces a yield of about 98.6%. A failure rate of 100 parts per million produces a yield of only 24.7%. Some companies have been programming antifuse chips at the factory according to customer specifications, in order to not burden the user with the inconvenience of handling failed devices and to maintain a reputation for reliability. This procedure decreases the convenience of field programmability, and increases the time required to turn a design into a programmed device.

The statistics become quickly worse for larger devices. In a larger device having 2.5 million antifuses of which 2% or 50,000 will be programmed, a failure rate of 1 antifuse per million produces a yield of about 95.1% and a failure rate of 100 antifuses per million produces a yield of only 0.7%. These poor yields have prevented the manufacture of large antifuse devices.

SUMMARY OF THE INVENTION

According to the present invention, the chip architecture includes more wiring segments and antifuses than are typically needed for routing of signals through the interconnect structure. The software algorithms attempt to preserve an even distribution of unused routing resources. Antifuses and wiring segments not used in an initial routing selection can be used for patches, that is, to route around antifuses which fail to become conductive during programming. Programming of antifuses is controlled by a computer which can store the initially determined routing list and which can run software which uses the initial routing list plus other necessary information to revise the initial routing. Each antifuse is tested after programming. If an antifuse fails to become conductive upon programming, according to the present invention, adaptive routing software selects an alternate route to complete the connection which would have used the failed antifuse. This alternative route may use the initially unused wiring segments and antifuses, or may be chosen by recalculating the routes for all paths not yet routed.

As mentioned earlier, simple programming boxes used in prior art programming methods are merely able to indicate whether a device programmed properly. They do not have the computing power to select alternative routes.

According to the invention, programming of the device is controlled by a computer which can re-calculate routing in response to information provided by the programming device. This is preferably the same computer which formed the initial list of antifuses. That computer also has access to data files generated during the initial layout steps and can revise the routing as necessary to generate an alternative set of routes to bypass the failed antifuse. Need for a separate programming box with a separate microprocessor is eliminated. The computer which controls programming is also preferably able to analyze timing, and perform other computations performed when the initial routing was selected.

The ratio of reserved wiring segments to wiring segments used during the routing calculation is preferably several times as high as the ratio of expected antifuse failures to total antifuses programmed. However, since the ratio of failed antifuses is easily less than 1 to 1000, a ratio of reserved segments on the order of 1 to 100 is sufficient to accommodate almost all failures with only a 1% increase in area.

DETAILED DESCRIPTION OF THE INVENTION

Figure 2:
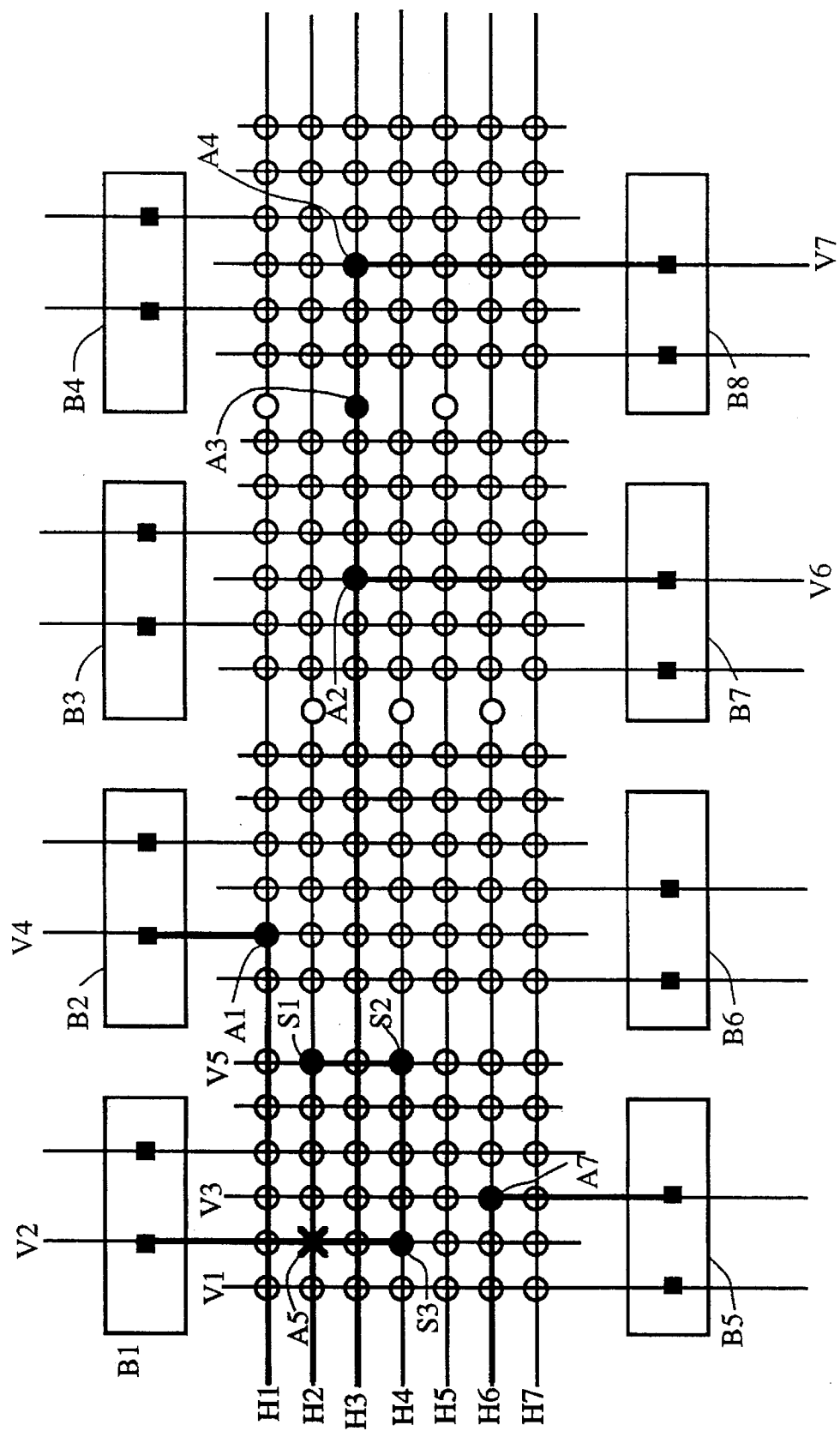
FIG. 2 shows a portion of an antifuse programmable logic cell array which can be adaptively routed in response to an antifuse which fails to program.

FIG. 2 shows an overview of an antifuse programmable logic cell array which can be adaptively programmed in response to an antifuse which fails to program. Logic blocks B1 through B8 represent programmable logic blocks which can be programmed to perform multiple functions. The blocks must be connected to each other through an interconnect structure to cause the device to perform an overall function desired by the user. The interconnect structure comprises horizontal interconnect lines H1 through H7, vertical interconnect lines, such as V1 through V5 and antifuses represented by circles. For simplicity, some interconnect lines are not labeled and most antifuses are not labeled. An antifuse is positioned at each or at most intersections of the horizontal and vertical interconnect lines. Unprogrammed antifuses are represented by white circles. Programmed antifuses are represented by black circles. Some lines are shown as segmented, so that different segments of the same line can be used for different signals. These segmented lines can be interconnected by antifuses. In the example of FIG. 2, it is desired to connect horizontal line H1 to vertical line V4 through antifuse A1. Thus sufficiently different programming voltages are applied to horizontal line H1 and vertical line V4 to cause antifuse A1 to become programmed. The black circle shows that antifuse A1 has been programmed. Likewise, it is desired to connect horizontal line H3 to vertical lines V6 and V7, which is accomplished by programming antifuses A2, A3, and A4. It is further desired to connect horizontal line H2 to vertical line V2, which in turn connects to a particular port in block B1. However, the x at the intersection of horizontal line H2 and vertical line V2 indicates that antifuse A5 at that intersection failed to become conductive when programming voltages were applied to lines H2 and V2. According to the invention, in order for the device to perform the desired function, another path is located and programmed. Segmented redundant horizontal line H4 and vertical line V5 and antifuses S1, S, and S3 are used to form an alternative path from H2 to V2. Thus an alternative path to the desired destination is completed.

If the antifuse defect density is even moderately high, for example one hundred defects per million antifuses, a small number of redundant lines is sufficient to tremendously increase the yield of successfully programmed devices. As shown in TABLE I, without adaptive routing, yield falls sharply with both increased defect density and with device size. The first condition in TABLE I shows yield when no adaptive routing is used. The second each other wiring segment along more than one path. If an antifuse on a first path fails to program, a second path not including the antifuse which failed to program can connect the same logic elements as would have been connected by a path including the failed antifuse. There should be a way to bypass any antifuse, so that failure of a single antifuse never causes failure of the entire device. Short segments are particularly useful for forming alternative routes, since they add little capacitance (therefore delay) to the total path. Some devices typically use long segments for carrying a clock signal or other high fanout signal which needs low skew. When the wiring segments include a mix of long and short segments, one preferred architecture allows one long segment to be connected to another long segment both directly through a single antifuse and through a short segment plus two antifuses.

It is possible to designate lines and antifuses not to be used during the initial routing calculation, then program all routes in the calculated design before making any repairs, and finally make the repairs using the unused lines and

TABLE I

DEVICE YIELD VS ANTIFUSE PROGRAMMING YIELD

| | N = | | | | | |
|---|---|---|---|---|---|---|
| | 14,000 ANTIFUSES TO PROGRAM | | | 50,000 ANTIFUSES TO PROGRAM | | |
| | F = | | | | | |
| CONDITION | 1 ppm | 10 ppm | 100 ppm | 1 ppm | 10 ppm | 100 ppm |
| 1. No adaptive routing Yield = $(1 - F)^N$ | 98.6% | 86.9% | 24.7% | 95.1% | 60.7% | 0.7% |
| 2. 90% antifuses repairable Yield = $(1 - F \cdot U)^N$ | 99.9% | 98.6% | 86.9% | 99.5% | 95.1% | 60.7% |
| 3. 99% antifuses repairable Yield = $(1 - F \cdot U)^N$ | 99.99% | 99.9% | 98.6% | 99.95% | 99.5% | 95.1% |
| 4. 100% antifuses repairable Yield = $(1 - F^2)^N$ | ~100% | 99.9999% | 99.99% | ~100% | 99.9995% | 99.95% |

F = fraction of antifuses which fail to program
U = fraction of antifuses for which no repair is available
N = number of antifuses to be programmed
ppm = parts per million, here failed antifuses per million condition in TABLE I shows yield for different defect densities and device sizes when 90% of the antifuses have a repair option. Condition 3 shows yield when 99% of the antifuses have a repair option, and condition 4 shows yield when 100% of the antifuses have a repair option, that is, when another path can be found for any failed antifuse. The values in TABLE I are based on the following assumptions: (1) failures do not cluster so that repair options fail together with initial failures, (2) only one repair option will be tried (thus the numbers are lower bounds; if a first attempted repair failed and a second attempt were made, the second attempt may succeed, further decreasing the failure rate), and (3) timing degradation can be tolerated. The improvement offered by the present invention is clearly several orders of magnitude.

Figure 1:
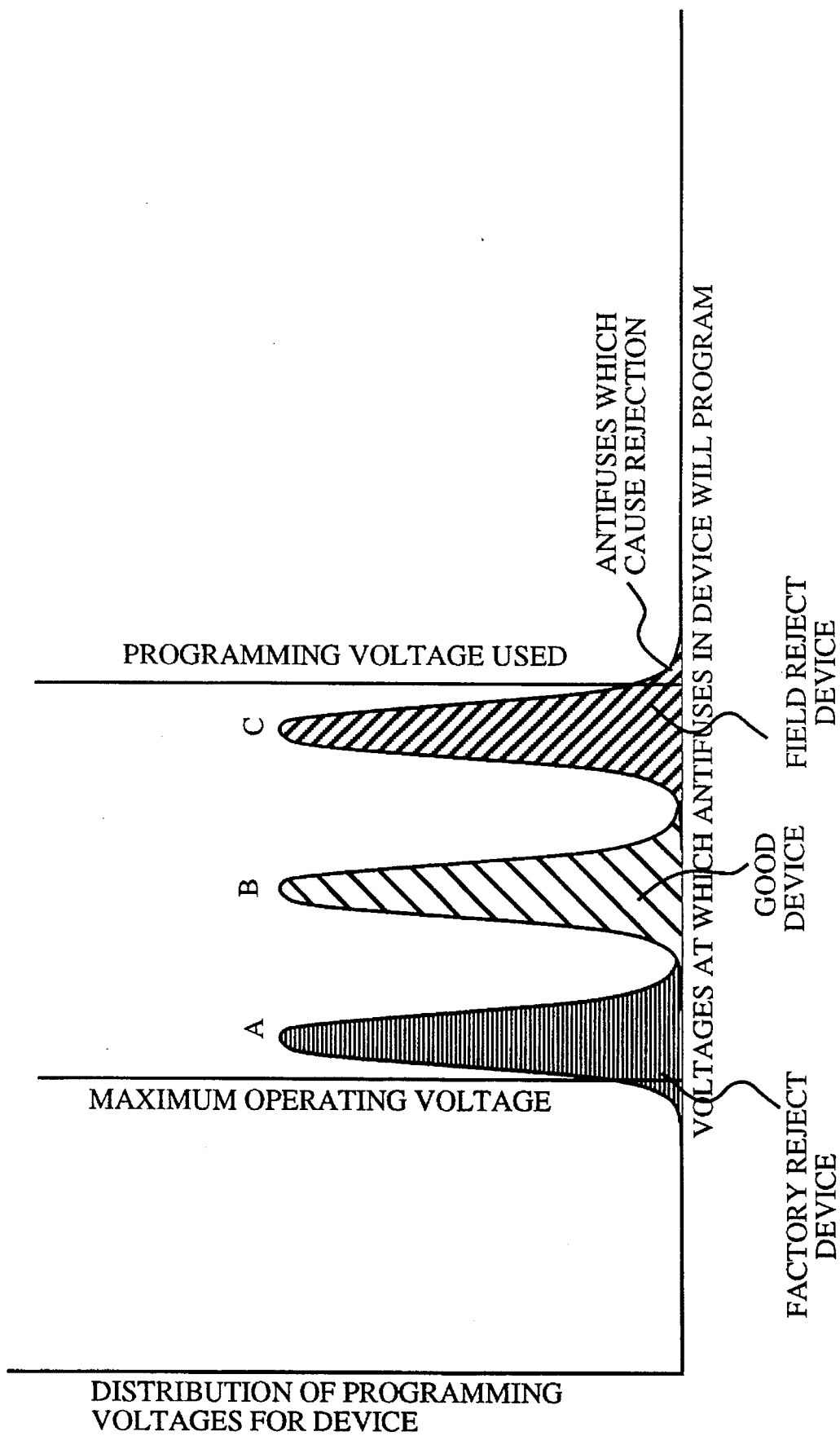
FIG. 1 shows a curve of voltage distribution and ranges over which devices are accepted and rejected.

In particular, if there are 50,000 antifuses to program, the right column of TABLE I shows that providing alternative paths around every antifuse in a device having an antifuse failure rate of 100 antifuses per million brings yield from a totally unacceptable 0.7% to an acceptably 99.95%. Referring back to FIG. 1, the region labeled "ANTIFUSES WHICH CAUSE REJECTION" is largely dealt with by the method of the invention, to the extent shown in TABLE I.

The architecture is preferably arranged for 100% repairability, so that each wiring segment may be connected to antifuses. The recalculation when unused wiring segments and antifuses have been reserved is on the order of a few milliseconds, short enough that a user will not be inconvenienced by the delay, or even aware of the delay. Alternatively, for any or all parts of paths in which antifuses are not yet programmed, it is possible to recompute routing directly after a failure is noted. Any paths, parts of paths, and placements not yet committed by programmed antifuses may be changed.

Placement and routing are typically selected in order to meet certain timing requirements of the user. Some paths will meet their timing requirements with more time to spare than others. In order for any necessary repairs to also meet timing requirements, the order of antifuse programming may be selected so that paths having the least time to spare are programmed first. In an embodiment in which recalculation is performed directly after an antifuse failure, programming the tightest paths first means that failure of an antifuse can more likely be successfully repaired (within a tight timing requirement) when more unprogrammed resources remain.

Regarding timing degradation due to repair, the initial placement and routing may be selected such that all timing requirements are met with time to spare. This time to spare can be used in the adapted routing paths and a user's timing requirement will still be met.

Pin, Interconnect, Cell, and Block Swapping to Maintain Timing

It is preferable to preserve the timing when adapting to a failed antifuse. An alternative route as selected above is almost always slower than the original route (which could not be completed because of a failed antifuse). There are situations in which placement and routing cannot be found in which there is sufficient time to spare for a repair which slows the timing. There are also situations in which the user has performed timing simulations and expects a particular timing for every path in a design. It may be unacceptable to have a change in timing for some paths in one device compared to the identical paths in other devices. Thus a change in timing because of a failed antifuse in that device may cause the device to be rejected. It is preferable, in response to antifuse failure, to find an alternative layout which does not change signal timing at all. Instead of adapting the routing, it is sometimes possible to adapt placement of the logic elements, or to alter which signals will feed which inputs to a logic function.

Interconnect Swapping

Figure 4:
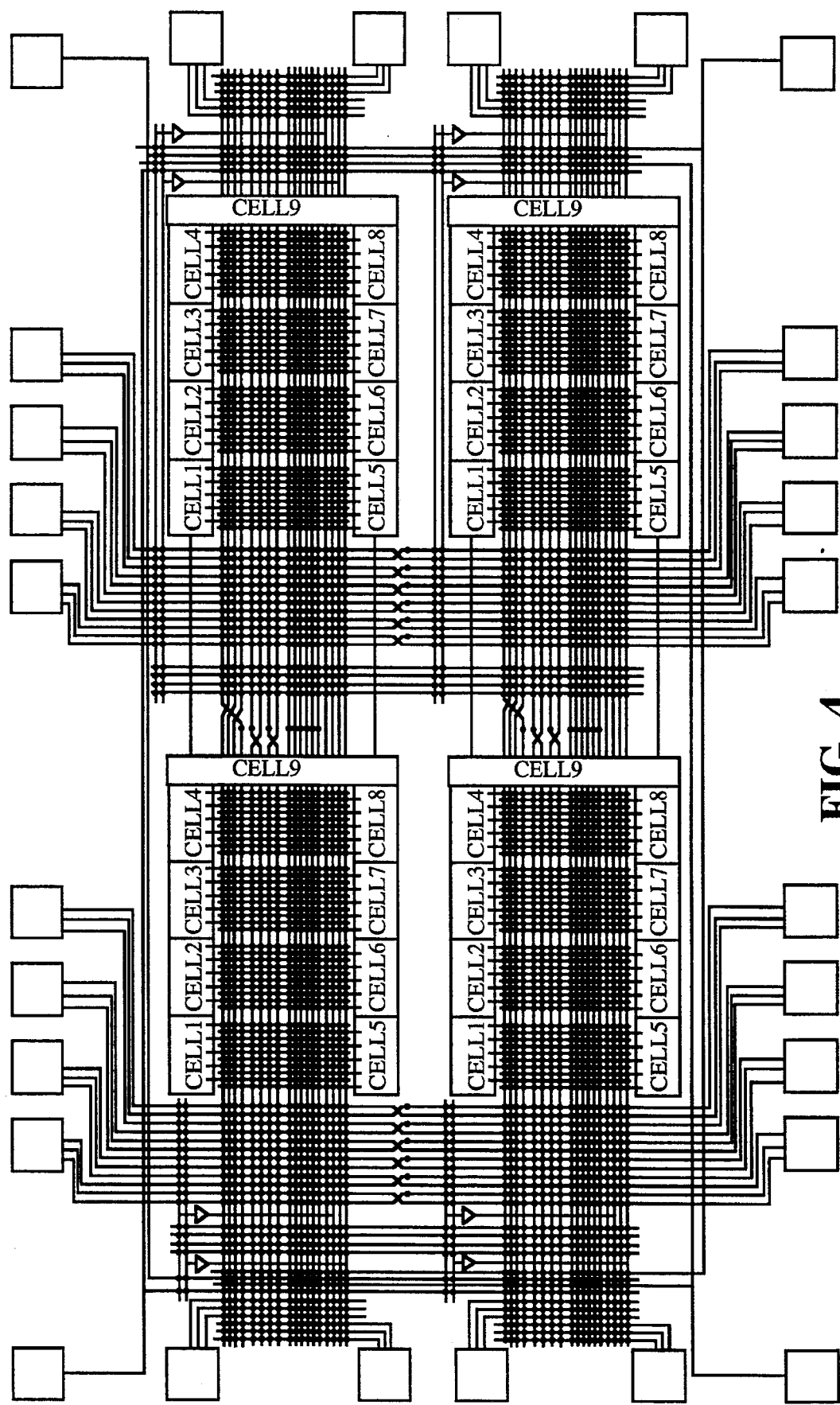
FIG. 4 shows a structure with which the invention is preferably used.

In one preferred embodiment, the method is used with a structure having cells grouped as shown in FIG. 4. The cells are preferably grouped into blocks of eight cells CELL_1 through CELL_8 with a ninth cell CELL_9 used for programming the antifuses but not performing logic. Logic performed in cells CELL_1 through CELL_8 receives input from several of the vertical segments shown in FIG. 4. The nine cells of a block combine with the antifuse interconnect structure (antifuses are represented by black dots) which are programmed to interconnect the cells to each other to implement a circuit design desired by a user. Four cell blocks are shown in FIG. 4. A typical integrated circuit array will comprise 100 to 1000 of these cell blocks such as shown in FIG. 4 plus peripheral I/O circuitry, clock oscillators, and other overhead circuitry usually positioned along the perimeter of the cell. Cells CELL_1 through CELL_4 are interconnectable through a special direct connection (called a cascade connection) which does not use the antifuse interconnect structure and is especially fast. CELL_5 through CELL_8 are likewise interconnectable. Some horizontal line segments positioned between the upper group of cells CELL_1 through CELL_4 and the lower group of cells CELL_5 through CELL_8 are minimum length interconnect line segments extending the length of one cell block and not continuous across cell CELL_9. Longer horizontal segments extend more than one block. Vertical segments extending between CELL_1 and CELL_4 are about one block high. The same is true for vertical segments extending between cells CELL_2, CELL_3, CELL_4 and CELL_6, CELL_7, CELL_8. Vertical segments to the left of CELL_1 and CELL_8 are about two blocks high, and allow cells in the upper blocks to be connected to cells in the lower blocks. The example shown is only two blocks wide and two blocks high, thus no segments are more than two blocks in length. However, in a typical integrated circuit array, some segments will extend a longer length, especially those intended for carrying global signals such as clock signals.

As can be seen in FIG. 4, many interconnect segments are interchangeable. In the event that a failed antifuse is adding a vertical segment which extends between cell blocks, another vertical segment in the same cell block can be used with no change in timing. This same result may be achieved with many of the horizontal segments.

Figure 4A:
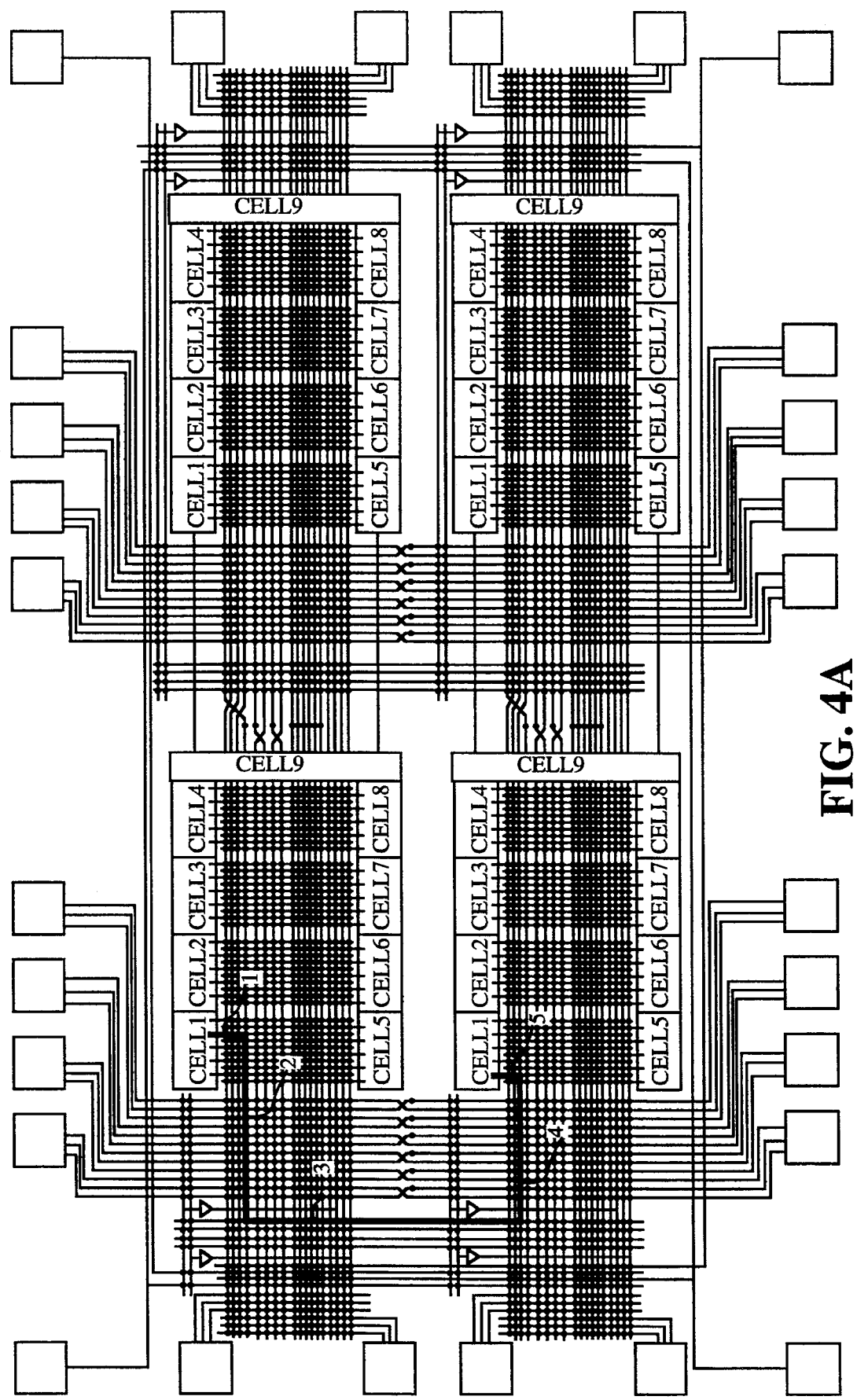
FIG. 4A shows the structure of FIG. 4 in which a planned path for interconnecting two logic elements is shown.
Figure 4B:
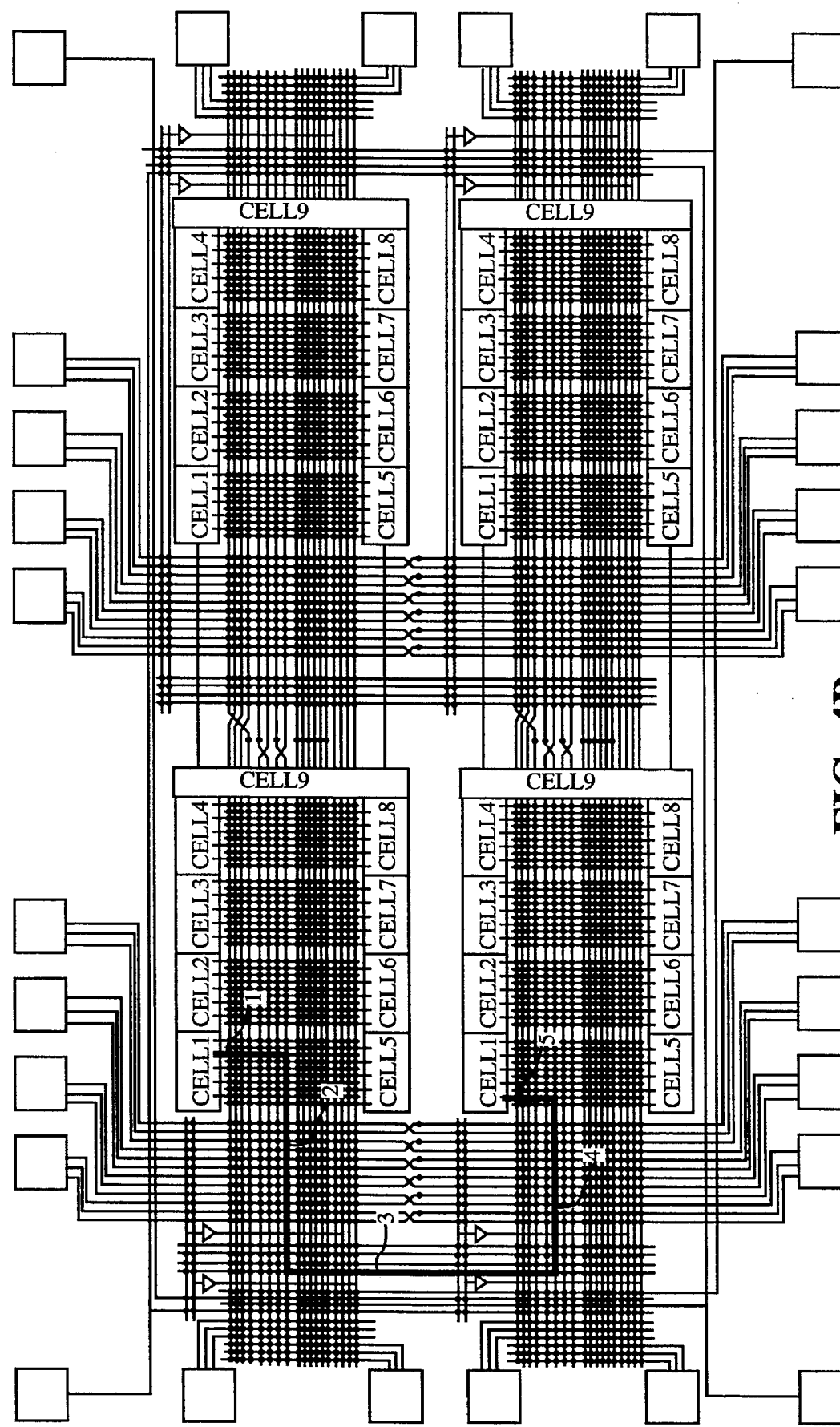
FIG. 4B shows an alternative path to that of FIG. 4A which resulted when antifuses on the planned path failed.

In general, if one cell output is being connected to another cell input through a sequence of wiring segments, there are multiple paths available which will have equal timing. For example, FIG. 4A shows the circuit of FIG. 4 in which a first path has been selected for connecting the output of cell CELL_1 to the input of another cell equivalent to CELL_1 in another block. Wiring segment 1 carries the output of CELL_1. In FIG. 4A, horizontal wiring segment 2 has been selected to carry the signal out of the upper left block in which CELL_1 is located. Vertical wiring segment 3 has been selected to propagate the signal to the lower left. Horizontal wiring segment 4 was selected to propagate the signal to the lower left block, and vertical wiring segment 5 leads to a logic input of the cell in the lower left block which is to receive the signal. Assuming antifuses will be programmed to connect the wiring segments in numerical order, the antifuse at the intersection of segments 1 and 2 is programmed first, and others later. FIG. 4B shows an alternative routing which is found if every antifuse fails except that connecting segments 4 and 5 (an unrealistically bad result, which nevertheless illustrates the adaptability). When failure of the antifuse connecting segments 1 and 2 is detected, a new horizontal segment 2' is selected (either a segment initially planned to be unused, or a used segment which can be switched with segment 2 or another segment) and the antifuse at the intersection of segments 1 and 2' is programmed. Then the antifuse at the intersection of segments 2' and 3 is attempted and fails, so the antifuse at the intersection of segments 2' and 3' is programmed instead, which is assumed to be successful. The antifuse at the intersection of 3' and 4 fails and is replaced by the antifuse at the intersection of 3' and 4'. Finally the antifuse at the intersection of 4' and 5 programs successfully. The successfully programmed path has the same number of wiring segments, each of the same length as the originally planned path, and the same number of antifuses. Thus the path delay is the same within statistical variation, and no delay has been added by the adapted routing.

Pin Swapping

The above example assumed that the last step in the path programmed successfully. It is of course not possible to predict which antifuses will fail, and some of the time it will be the last antifuse on a path which will fail. Such a failure may sometimes be accommodated by a method called pin swapping. Some inputs to a logic cell are interchangeable (for example inputs to an AND gate) such that signals coming to these inputs can be swapped with no change in the function performed by the cell. In the event that a failed antifuse leads to a logic cell input which can be swapped with another input to the same cell with no change in functionality, swapping the routes which carry two signals to the cell will repair the antifuse failure with no change in the timing. Also, such a swap does not consume additional wiring segments.

Figure 3:
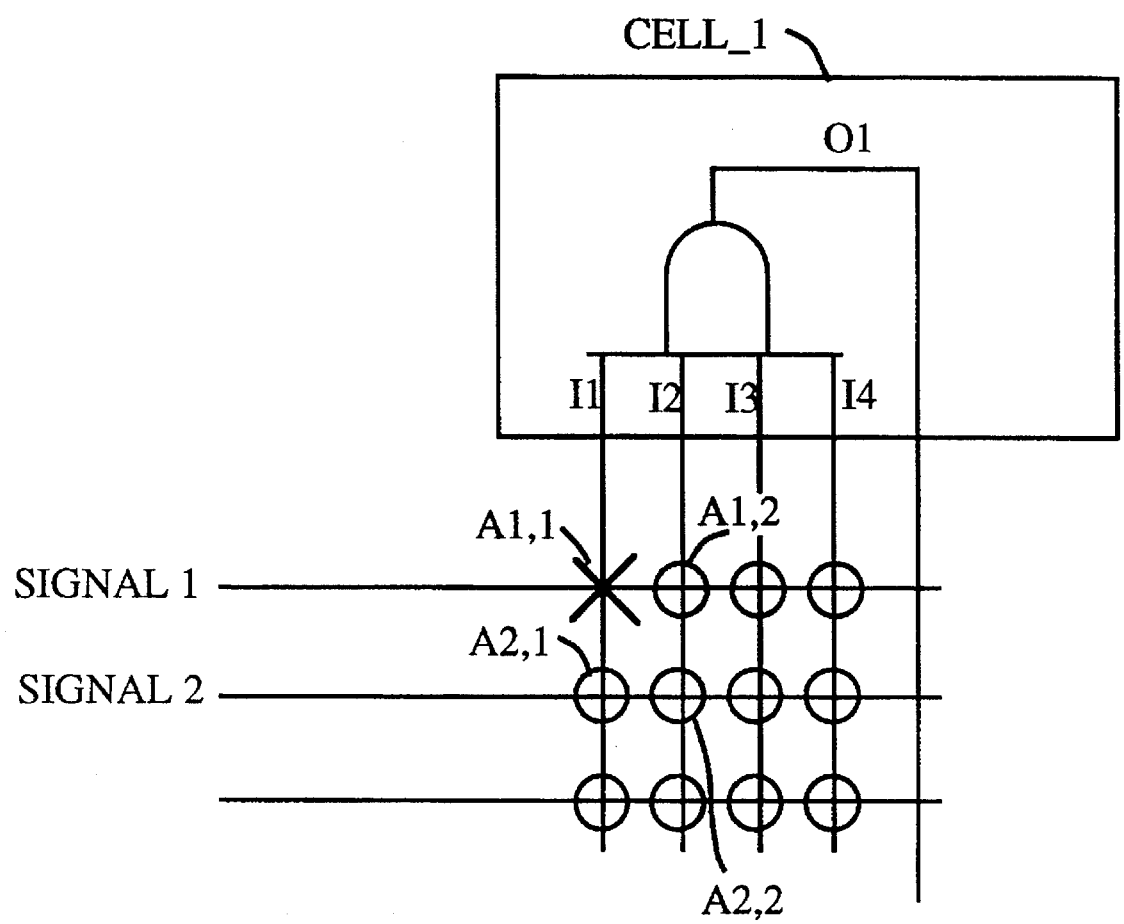
FIG. 3 shows signals to be supplied to an AND gate and equivalent paths available upon failure of an antifuse.

FIG. 3 shows a portion of a logic array in which two signals, signal 1 and signal 2 are to be applied to inputs of an AND gate. As originally decided, signal 1 will be applied to input I1 and signal 2 will be applied to input I2. Applying these signals requires the programming of antifuses A1,1 and A2,2. But when the programming of the first antifuse A1,1 is attempted, the antifuse fails to program. The identical function can be achieved with the identical timing by programming antifuses A1,2 and A2,1. Thus when antifuse A1,1 fails to program, the mapping is recalculated. Programming of antifuse A2,2 is not attempted. Instead, antifuses A1,2 and A2,1 are programmed and the repair is made with no degradation in timing. Alternatively, if antifuse A2,2 were already programmed before the failure of antifuse A1,1 was discovered, since the logic function illustrated is a four-input AND gate, signal 1 may be brought in on input I3 or input I4. Such alternatives enhance the repair methods discussed in connection with FIG. 2 and FIGS. 4, 4A and 4B.

Cell Swapping

Since the capacitance of connections leading to any cell in the same cell block of FIG. 4 will not be changed by swapping cells in the cell block, timing of a signal path will be the same for any cell in the cell block. Thus a defective antifuse can be avoided by exchanging the logic in one cell for the logic in another cell in the same block and adjusting the antifuses to be programmed accordingly. Since all cells in a cell block have equivalent connections to the horizontal segments extending through the block, the connections to the exchanged cells can be substituted with no change in timing and with no additional use of resources. However, if the logic cells to be connected by a failed antifuse make use of the cascade connection, their relationship to each other must be maintained in order for the expected timing to be maintained. Thus any cell swapping must take this cascading into account. Distributing unused cells to blocks in an array such than many blocks include unused cells increases the likelihood that one cell can be swapped with another (an unused one in the block) when antifuses leading to the first cell fail to program.

Figure 5:
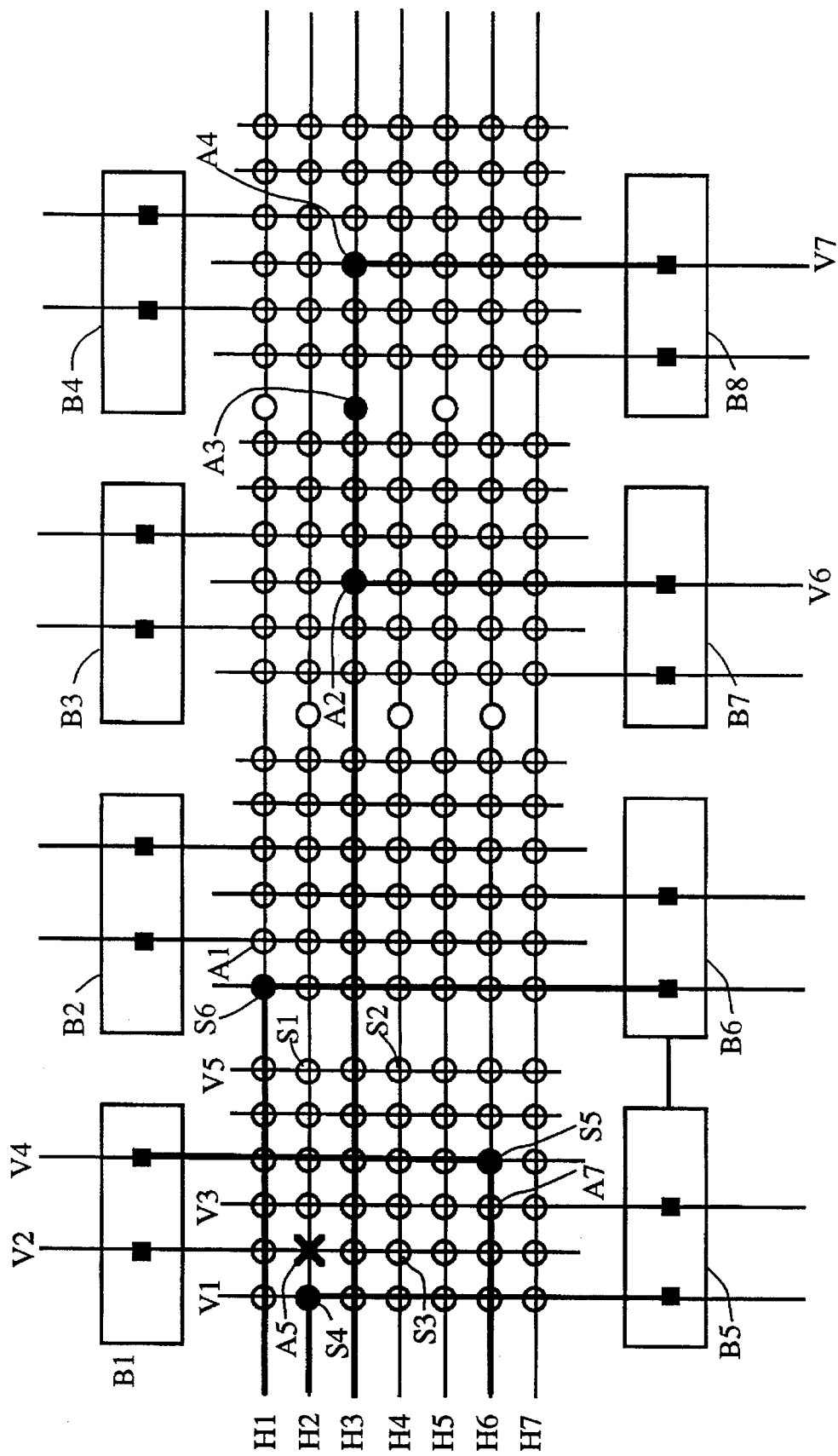
FIG. 5 shows an alternative adaptation which can correct the routing failure of FIG. 2.

FIG. 5 shows an alternative repair to that of FIG. 2, where cells B1 and B2 have been re-designated to swap functions with cells B5 and B6. Such a swap may be performed either if no antifuses have yet been programmed to commit these two sets of cells to their original functions at the time of the antifuse failure, if any antifuses which have been programmed connect identically to the two cells, or if an unused cell is available in the block. The example of FIG. 5, in which cells B1, B2, B5 and B6 have identical timing is assumed to have been planned such that the original use of cells B1 and B2 required the cascade feature between them. In the example of FIG. 2, the attempt to connect line H2 to line V2 resulted in a failed antifuse A5. Here, in order to maintain timing, which requires maintaining the cascade connection and also maintaining the delay of each path in the interconnect structure, cells B1 and B2 are swapped for cells B5 and B6, and the attempt to program the antifuses is repeated. The result is shown in FIG. 5. Antifuse S4 is programmed to connect line H2 to line V1, which connects to cell B5. Antifuse S5 is programmed to connect line H6 to line V4, which connects to cell B1. Antifuse S6 is programmed to connect line H1 to a vertical line leading into cell B6. Thus antifuses A1 and A7 are not used as originally planned. Of course, to make this adjustment in the planned routing, antifuses A1 and A7 must not yet have been programmed at the time the failure of antifuse A5 occurs.

In order to allow further flexibility in correcting for defects when it is preferred to maintain timing, some inputs to a logic cell may be left initially unused and some logic blocks may be reserved for use during the repair phase, in addition to reserving some cells within a block for adaptive swapping of cells.

In order to allow the user a choice between maintaining timing control and achieving maximizing yield of programmed parts, a provision can be made in the programming software to let the user specify that the part must be rejected if a repair can not be made without changing the timing.

Other embodiments of the invention will become obvious to those skilled in the art in light of the above description. For example, even though the embodiments above are described in conjunction with a logic device, that is a device having both interconnections and logic elements, the invention works with a device which includes interconnect only and does not include logic elements. Also, even though the invention has been described in connection with antifuses, it will work with other one-time programmable technologies as well. Such other embodiments are intended to fall within the scope of the present invention.

We claim:

1. A method of programming a programmable device having interconnect wiring segments and programmable elements which programmably connect said wiring segments to each other, said method comprising the steps of:

providing a design in machine readable form, said design comprising connections between selected nodes in said device;

for each of said connections, selecting active wiring segments and active programmable elements in said programmable device to implement said connection, thereby to form a route for said connection;

programming at least some of said active programmable elements;

if during programming any of said active programmable elements fails to become conductive, selecting from those programmable elements not yet programmed an alternative set of programmable elements to complete said connections;

programming said alternative set of programmable elements, thereby to form an implementation of said design.

2. A method as in claim 1 comprising the further step of leaving spare wiring segments and spare programmable elements not used initially for any of said connections.

3. A method as in claim 1 in which said design comprises a logic design comprising both design elements and said connections, and said device further comprises logic elements, said programmable elements programmably connecting said logic elements to said wiring segments, said method comprising the further steps of:
selecting one of said logic elements to implement each of said design elements;
leaving spare logic elements not used initially for any of said design elements.

4. A method as in claim 1 in which said design comprises a logic design comprising both design elements and said connections, and said device further comprises logic elements grouped into blocks, said programmable elements programmably connecting said logic elements to said wiring segments, said method comprising the further step of:
leaving spare blocks not used initially for any of said design elements.

5. A method as in claim 1 in which said design comprises a logic design comprising both design elements and said connections, and said device further comprises logic elements, said programmable elements programmably connecting said logic elements to said wiring segments, said method comprising the further steps of:
selecting one of said logic elements to implement each of said design elements;

leaving spare logic element inputs not used initially in at least some of said logic elements.

6. A method as in claim 1 in which said active programmable elements are programmed in the order of time to spare for a path such that paths having the least time to spare in meeting a timing requirement are programmed first.

7. A method as in claim 1 in which said alternative set of programmable elements is selected such that paths selected after a programmable element failure have the same timing as corresponding paths selected before said programmable element failure.

8. A method as in claim 1 in which said alternative set of programmable elements is selected so that said implementation of said logic design meets the same timing requirements as would have been met if no programmable elements failed.

9. A method as in claim 1 in which said step of selecting an alternative set of programmable elements is performed after a first failed programmable element is found.

10. A method as in claim 1 in which
said design comprises a logic deign comprising both design elements and said connections, and
said device further comprises logic elements, said programmable elements programmably connecting said logic elements to said wiring segments,
said alternative set of programmable elements is selected to swap equivalent input ports of a logic element which will receive plural input signals, thereby avoiding said failed programmable element.

11. A method as in claim 1 in which all of said active programmable elements are programmed as part of a first programming step, and said alternative set of programmable elements are selected and programmed after said first programming step.

12. A method as in claim 1 in which said wiring segments comprise both horizontal and vertical wiring segments, and said programmable elements are positioned at intersections of said horizontal and vertical wiring segments, spare wiring segments being selected from both horizontal and vertical wiring segments.

13. A method as in claim 1 in which said alternative set of programmable elements is selected to swap equivalent wiring segments, thereby avoiding said failed programmable element.

14. A method of programming an antifuse programmable logic device having logic elements, interconnect wiring segments, and antifuses which programmably connect wiring segments to each other and to said logic elements, said method comprising the steps of:

providing a logic design in machine readable form, said logic design comprising design elements and connections for carrying a signal from an output terminal of one of said design elements to an input terminal of at least one of said design elements;

selecting one of said logic elements to implement at least one of said design elements;

for at least one of said connections, selecting active wiring segments and active antifuses in said antifuse programmable logic device to form a route from an output terminal of one of said design elements to an input terminal of at least one of said design elements;

selecting one of said logic elements to implement at least one of said design elements;

for said at least one of said connections, programming said active antifuses in order of signal flow from said output terminal of said one of said design elements to said input terminal of said at least one of said design elements;

if an antifuse fails to become conductive upon programming, for at least that connection of which said failed antifuse is a part, calculating an alternative route to complete that connection; and continuing to program active antifuses in said alternative route in order of signal flow to said input terminal of said at least one of said design elements.

* * * * *

UNITED STATES PATENT AND TRADEMARK OFFICE
CERTIFICATE OF CORRECTION

PATENT NO. : 5,498,979
DATED : March 12, 1996
INVENTOR(S) : David B. Parlour, F. Erich Goetting, Stephen M. Trimberger, Edel M. Young It is certified that error appears in the above-indentified patent and that said Letters Patent is hereby corrected as shown below:

Col. 1, line 46, delete "can not" and insert --cannot--.

Col. 3, line 63, after "device" insert --is--.

Col. 5, line 9, delete "S," and insert --S2,--.

Col. 9, line 26, delete "than" and insert --that--.

Col. 9, line 67, delete "can not" and insert --cannot--.

Col. 11, line 21, delete "deign" and insert --design--.

Signed and Sealed this

Twenty-third Day of September, 1997

Attest:

BRUCE LEHMAN

Attesting Officer

Commissioner of Patents and Trademarks